United States Patent
Sun et al.

(10) Patent No.: US 7,326,300 B2
(45) Date of Patent: Feb. 5, 2008

(54) COATING APPARATUS AND METHOD USING THE SAME

(75) Inventors: Lu Nan Sun, Miao-Li (TW); Ching Lung Wang, Miao-Li (TW); Wen Cheng Hsu, Miao-Li (TW); Yu-Ying Chan, Miao-Li (TW)

(73) Assignee: Innolux Display Corp., Chu-Nan, Miao-Li County (TW)

( * ) Notice: Subject to any disclaimer, the term of this patent is extended or adjusted under 35 U.S.C. 154(b) by 28 days.

(21) Appl. No.: 11/178,069

(22) Filed: Jul. 7, 2005

(65) Prior Publication Data

US 2006/0008591 A1    Jan. 12, 2006

(30) Foreign Application Priority Data

Jul. 9, 2004    (TW) .............................. 93120645 A

(51) Int. Cl.
*B05B 13/02* (2006.01)
*B25B 11/00* (2006.01)
(52) U.S. Cl. ........................... 118/305; 118/500; 269/21
(58) Field of Classification Search ................. 118/52, 118/612, 305, 300, 500; 269/21; 294/64.1; 134/157, 165, 82; 156/345.51, 345.54
See application file for complete search history.

(56) References Cited

U.S. PATENT DOCUMENTS

| 6,099,056 | A | * | 8/2000 | Siniaguine et al. | ........ 294/64.3 |
| 6,110,282 | A | | 8/2000 | Tateyama et al. | |
| 6,402,843 | B1 | * | 6/2002 | Siniaguine et al. | ......... 118/500 |
| 6,649,077 | B2 | | 11/2003 | Tsai et al. | |
| 2003/0047202 | A1 | * | 3/2003 | Worm | ........................ 134/157 |
| 2003/0191551 | A1 | * | 10/2003 | Gotoh et al. | ................ 700/121 |

* cited by examiner

*Primary Examiner*—Yewebdar Tadesse
(74) *Attorney, Agent, or Firm*—Wei Te Chung

(57) ABSTRACT

A coating apparatus (2) includes a work table (20) having a plurality of blowing holes (201) for suspending a substrate (200) thereabove, a coating unit (22) having a photoresist coating nozzle (222) and a supplying device (224) for photoresist material. The photoresist coating nozzle is disposed above the work table, and the supplying device connects to the coating nozzle for supplying photoresist thereto. In operation, the substrate to be coated is continuously suspended in the gas just above but not in contact with the work table. Therefore, accumulation of static electricity and/or foreign particles on the substrate can be avoided. Gas emitting from the blowing holes can remove foreign particles from the surface of the work table and the backside of the work table.

5 Claims, 4 Drawing Sheets

COATING APPARATUS AND METHOD USING THE SAME

FIELD OF THE INVENTION

The present invention relates to a coating apparatus and a coating method, for coating photoresist during a semiconductor type manufacturing process or similar process.

BACKGROUND

Photolithography is a process of transferring geometric shapes on a mask to the surface of a silicon wafer or substrate of a liquid crystal display. Typically, the steps involved in the photolithographic process are: wafer cleaning; barrier layer formation; photoresist application; soft baking; mask alignment; exposure and development; and hard baking. Photoresist application is an important step during photolithography.

FIG. 6 shows a conventional photoresist coating apparatus. The coating apparatus 10 includes a work table 16, a photoresist coating nozzle 11, a supplying device 12 for supplying photoresist, a slot 15 for cleaning of the nozzle 11, and two guide rails 17 disposed on two opposite sides of the work table 16. Two opposite ends of the nozzle 11 are respectively connected to the guide rails 17. The nozzle 11 is connected to the supplying device 12. An LCD substrate 13 to be coated is fixed on the work table 16.

Referring to FIG. 7, in operation, the supplying device 12 supplies photoresist 14 to the nozzle 11, the nozzle 11 progressively slides along the guide rails 17 from point A to point B, and the photoresist is progressively coated on the substrate 13 as a continuous layer by the nozzle 11. After coating, the nozzle 11 should be dipped into the slot 15 for cleaning.

However, there are some difficulties that can arise in the coating process using the coating apparatus 10. There may be some foreign particles on the surface of the work table 16 or on the backside of the substrate 13, due to unclean working conditions. Static electricity may be produced between the substrate 13 and the work table 16. The foreign particles and the static electricity may result in imperfections in the coating process.

What is needed, therefore, is a coating apparatus and a coating method that can help to overcomes these difficulties.

SUMMARY

One embodiment of the present invention is a coating apparatus. The coating apparatus includes a work table having a plurality of blowing holes and adsorbent holes for stably positioning a substrate right above the work table; and a coating unit, having a photoresist coating nozzle, and a supplying device for photoresist material. The photoresist coating nozzle is disposed above the work table, and the supplying device connects to the coating nozzle for supplying photoresist thereto.

Another embodiment of the present invention is a coating method, which includes the steps of: (a) providing a substrate on a work table, the work table comprising a plurality of blowing holes and adsorbent holes for stably positioning the substrate right above the work table; and (b) coating photoresist on the substrate using a photoresist coating nozzle.

In operation, the substrate to be coated is continuously suspended in the gas just above but not in contact with the work table. Therefore accumulation of static electricity and/or foreign particles on the substrate can be avoided. Gas emitting from the blowing holes and being sucked in by the adsorbent holes can remove foreign particles from the surface of the work table and the backside of the work table.

Other advantages and novel features of various embodiments will become more apparent from the following detailed description when taken in conjunction with the accompanying drawings.

DETAILED DESCRIPTION OF PREFERRED EMBODIMENTS

Figure 1:
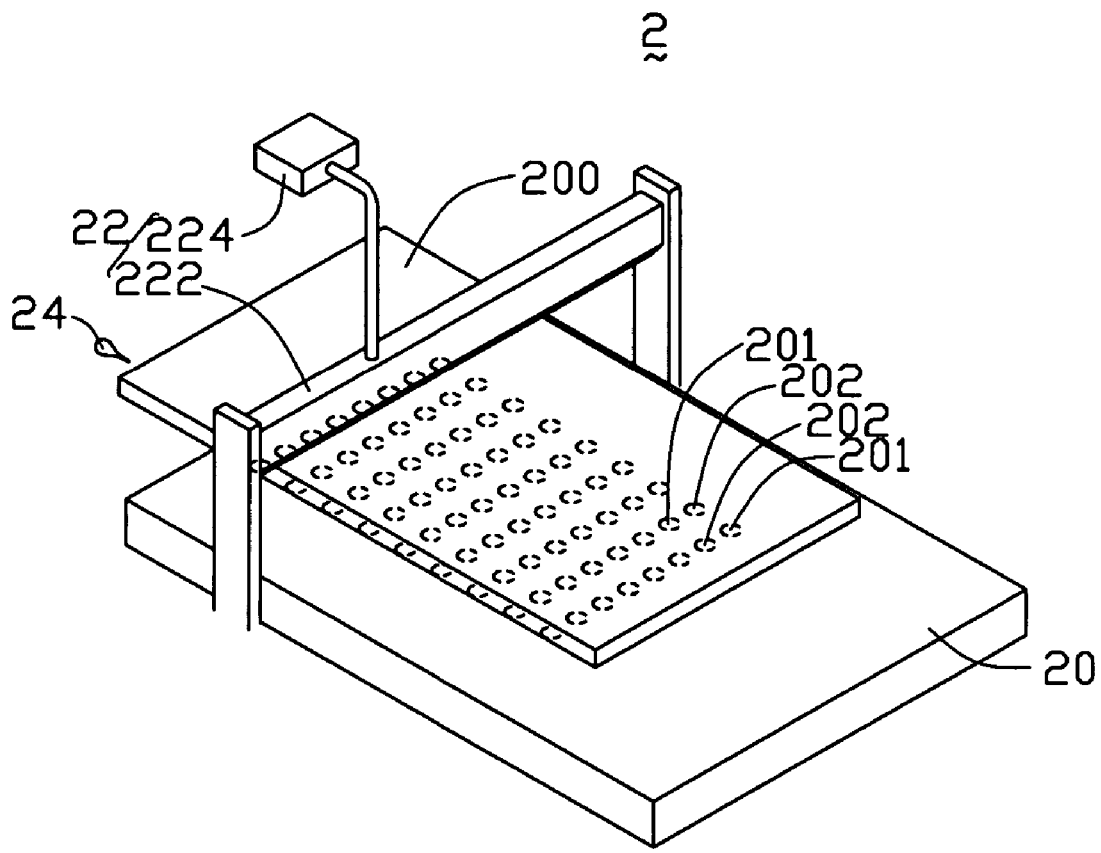
FIG. 1 is a schematic, isometric view of a photoresist coating apparatus according to the first embodiment of the present invention, together with a substrate positioned thereon.

As shown in FIG. 1, a coating apparatus 2 includes a work table 20, a coating unit 22, and a pulling device 24. The work table 20 has a plurality of blowing holes 201 and a plurality of adsorbent holes 202. The blowing holes 201 and the adsorbent holes 202 are arranged in an array, and are alternately disposed within the array. A substrate 200 to be coated is stably positioned right above the work table 20 by the blowing holes 201 and the adsorbent holes 202. The coating unit 22 includes a photoresist coating nozzle 222, and a supplying device 224 for providing photoresist material. The photoresist coating nozzle 222 is fixed above the work table 20. The supplying device 224 is connected to the photoresist coating nozzle 222, for supplying photoresist thereto.

Figure 2:
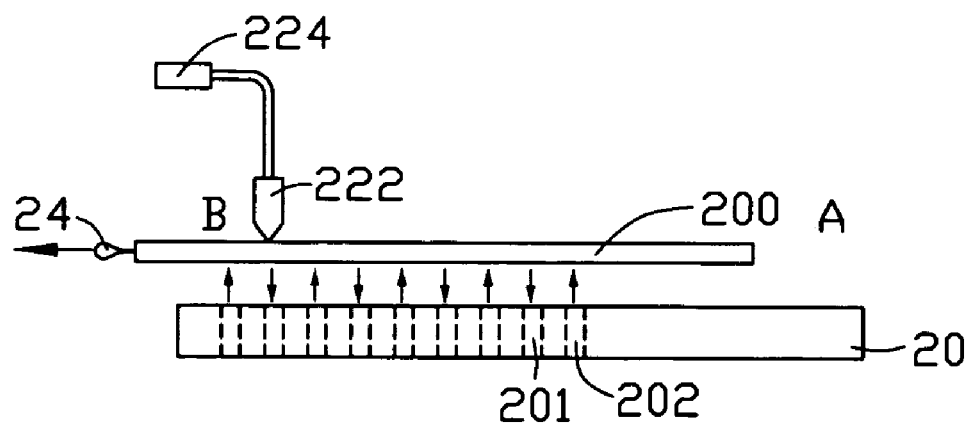
FIG. 2 is a schematic, side view of the coating apparatus and substrate of FIG. 1, showing the substrate being coated.

As shown in FIG. 2, in operation, the substrate 200 is placed on the work table 20. Then the blowing holes 201 blow gas out and the adsorbent holes 202 suck gas in, in order to stably position the substrate 200 right above the work table 20. The photoresist coating nozzle 222 coats photoresist onto the substrate 200 as a distal end of the substrate 200 progressively slides from position A to position B by action of the pulling device 24 on the substrate 200.

The substrate 200 is continuously suspended in the gas just above but not in contact with the work table 20. Therefore accumulation of static electricity and/or foreign particles on the substrate 200 can be avoided. Gas emitting from the blowing holes 201 and being sucked in by the adsorbent holes 202 can remove foreign particles from the surface of the work table 20 and the backside of the work table 20.

Figure 3:
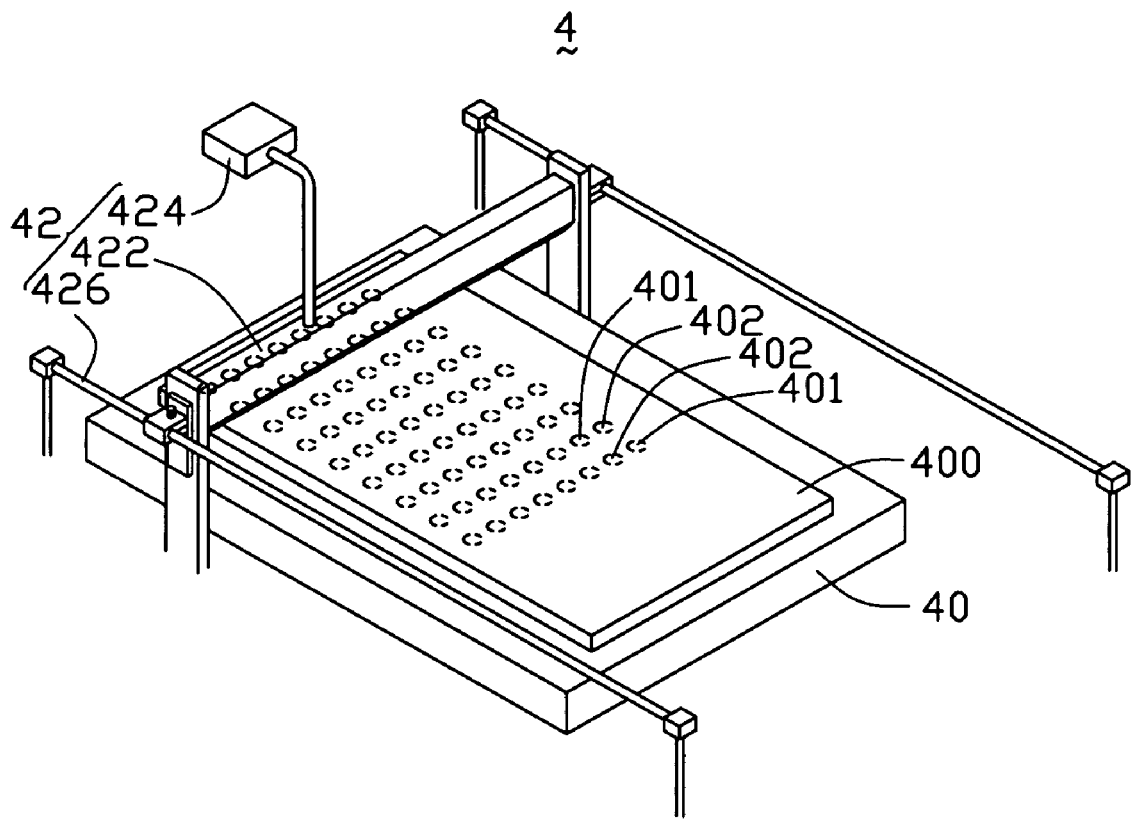
FIG. 3 is a schematic, isometric view of a photoresist coating apparatus according to the second embodiment of the present invention, together with a substrate positioned thereon.

As shown in FIG. 3, a coating apparatus 4 is similar to the coating apparatus 2. The coating apparatus 4 includes a work table 40 and a coating unit 42. The work table 40 has a plurality of blowing holes 401 and a plurality of adsorbent holes 402. The blowing holes 401 blow gas out, and the adsorbent holes 402 suck gas, in order to stably position a substrate 400 to be coated. Photoresist from the photoresist coating nozzle 422 is coated onto the substrate 400.

The coating unit 42 includes a photoresist coating nozzle 422, a supplying device 424 for supplying the photoresist, two guide rails 426, and a plulling device (not shown). The guide rails 426 are disposed at two opposite lateral sides of the work table 40 respectively, and are connected to two ends of the photoresist coating nozzle 422 respectively.

Figure 4:
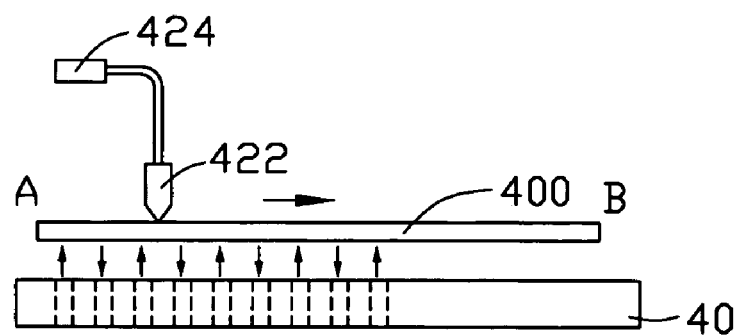
FIG. 4 is a schematic, side view of the coating apparatus and substrate of FIG. 2, showing the substrate being coated.

As shown in FIG. 4, in operation, the substrate 400 is placed on the work table 20. Then the blowing holes 201 blow gas out and the adsorbent holes 202 suck gas in, in order to stably position the substrate 200 right above the work table 20. The photoresist coating nozzle 422 coats photoresist on the substrate 400, as the photoresist coating nozzle 422 is moved from position A to position B along the guide rails 426.

Figure 5:
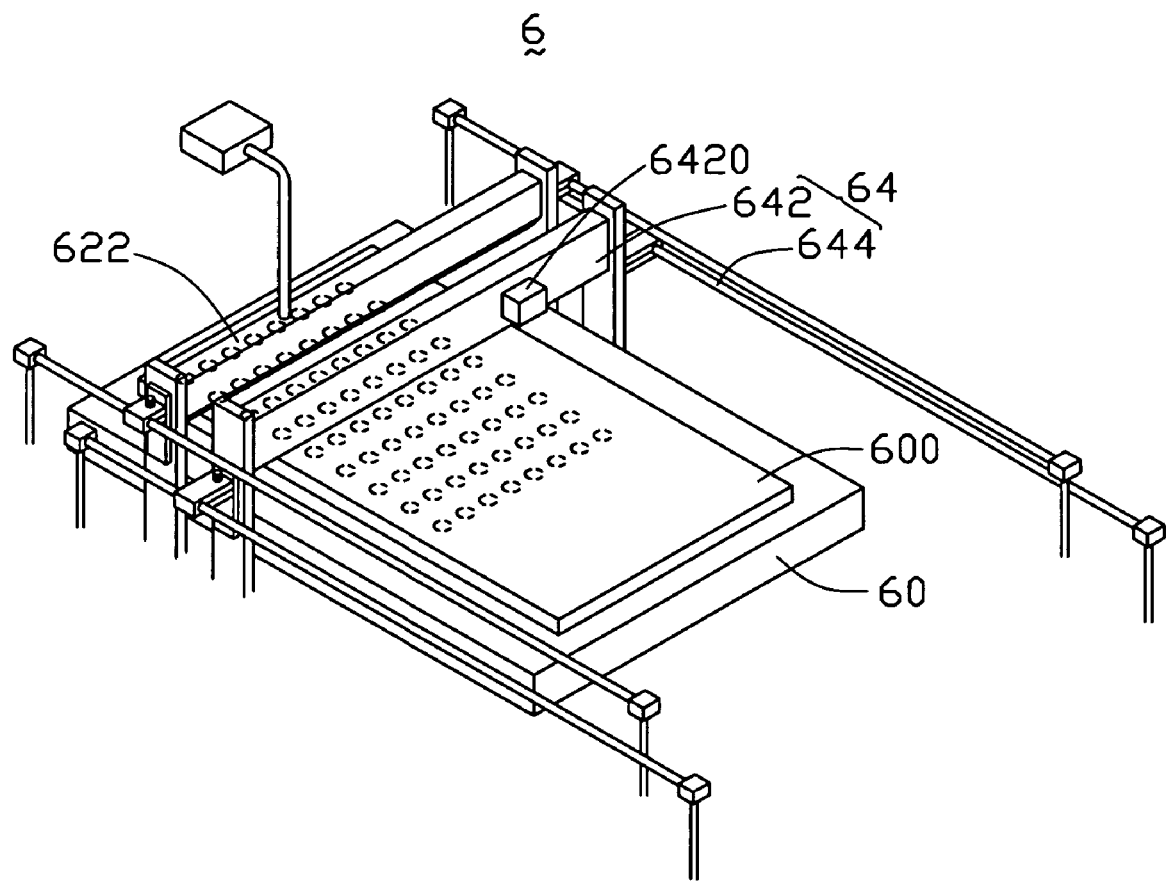
FIG. 5 is a schematic, isometric view of a photoresist coating apparatus according to the third embodiment of the present invention, together with a substrate positioned thereon.
Figure 6:
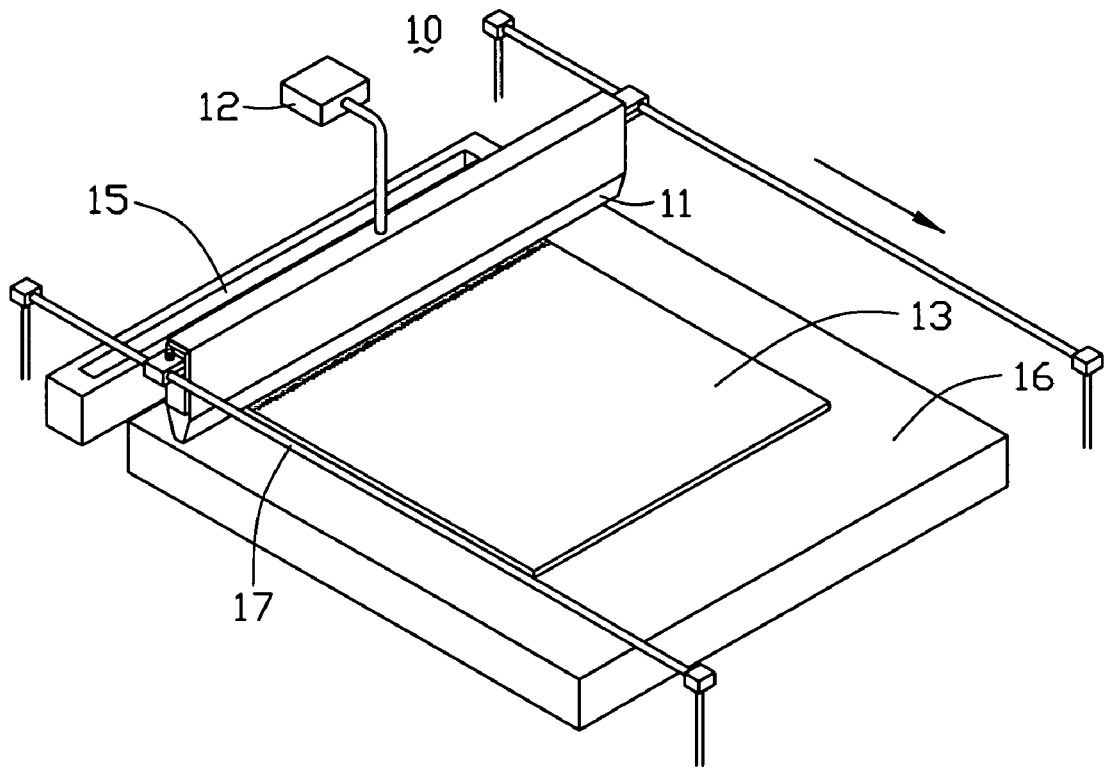
FIG. 6 is a schematic, isometric view of a conventional photoresist coating apparatus, together with a substrate positioned thereon.
Figure 7:
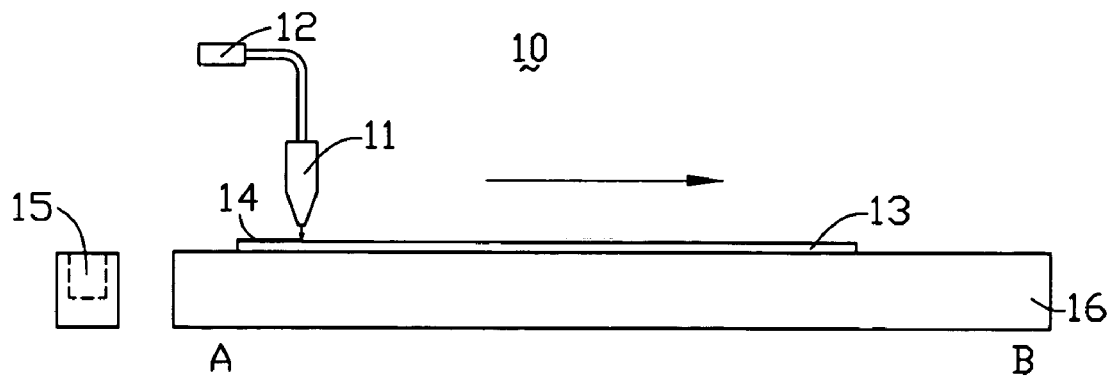
FIG. 7 is a schematic, side view of the coating apparatus and substrate of FIG. 6, showing the substrate being coated.

As shown in FIG. 5, a coating apparatus 6 is similar to the coating apparatus 4. However, the coating apparatus 6 further includes a dust eliminating device 64. The dust eliminating device 64 has an ultrasonic dust eliminating unit 642 and two guide rails 644. The ultrasonic dust eliminating unit 642 is positioned in front of the photoresist coating nozzle 622, straddling a work table 60. The ultrasonic dust eliminating unit 642 is controlled by a control unit 6420, to selectively eliminate any dust that may be on the surface of a substrate 600 to be coated. This can improve the quality of the coating process.

It is to be understood, however, that even though numerous characteristics and advantages of the embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A coating apparatus, comprising:
   a work table comprising a plurality of blowing holes for suspending a substrate thereabove and a plurality of adsorbent holes for stably positioning the substrate thereabove; and
   a coating unit, comprising a photoresist coating nozzle, and a supplying device for supplying photoresist, the photoresist coating nozzle being disposed above the work table, and the supplying device being connected to the coating nozzle for supplying photoresist thereto;
   wherein the blowing holes and the adsorbent holes are alternately disposed in an array.

2. The coating apparatus as claimed in claim 1, further comprising a pulling device for moving the substrate relative to the coating unit.

3. The coating apparatus as claimed in claim 1, wherein the coating unit further comprises two guide rails at two opposite sides of the work table, and the photoresist coating nozzle is slidably connected to the guide rails.

4. The coating apparatus as claimed in claim 3, wherein the photoresist coating nozzle can slide along the guide rails.

5. The coating apparatus as claimed in claim 4, further comprising a dust eliminating device.

\* \* \* \* \*